United States Patent [19]

Burn

[11] Patent Number: 4,766,027

[45] Date of Patent: Aug. 23, 1988

[54] METHOD FOR MAKING A CERAMIC MULTILAYER STRUCTURE HAVING INTERNAL COPPER CONDUCTORS

[75] Inventor: Ian Burn, Hockessin, Del.

[73] Assignee: E. I. Du Pont de Nemours and Company, Wilmington, Del.

[21] Appl. No.: 3,259

[22] Filed: Jan. 13, 1987

[51] Int. Cl.$^4$ .................. B32B 3/00; B32B 15/00; C04B 35/64; C04B 33/34

[52] U.S. Cl. .................. 428/210; 428/208; 428/428; 428/901; 428/432; 156/239; 156/89; 269/63; 269/175; 427/44; 427/125; 524/106; 524/555

[58] Field of Search .............. 428/210, 209, 428, 432; 156/239, 89; 264/63, 175; 427/44, 125; 524/106, 555, 563

[56] References Cited

U.S. PATENT DOCUMENTS

| | | | |
|---|---|---|---|
| 3,991,029 | 11/1976 | Adelman | 524/555 |
| 3,998,405 | 10/1976 | Smith et al. | 264/63 |
| 3,998,917 | 12/1976 | Adelman | 524/563 |
| 4,101,952 | 7/1978 | Burn | 361/305 |
| 4,234,367 | 11/1980 | Herron et al. | 156/89 |
| 4,308,570 | 12/1981 | Burn | 361/320 |
| 4,387,131 | 6/1983 | Anderson et al. | 428/210 |
| 4,496,509 | 1/1985 | Kita et al. | 264/175 |
| 4,510,000 | 4/1985 | Kumar et al. | 427/125 |
| 4,546,065 | 10/1985 | Amendola et al. | 430/5 |
| 4,551,357 | 11/1985 | Takeuchi | 427/96 |
| 4,562,092 | 12/1985 | Wiech, Jr. | 427/58 |
| 4,598,037 | 7/1986 | Felten | 427/44 |
| 4,607,314 | 8/1986 | Wada et al. | 361/321 |
| 4,607,315 | 8/1986 | Wada et al. | 361/321 |
| 4,607,316 | 8/1986 | Wada et al. | 361/321 |
| 4,612,600 | 9/1986 | Hodgkins | 361/321 |
| 4,632,846 | 12/1986 | Fujnaka et al. | 427/96 |
| 4,663,079 | 5/1987 | Yamaguchi et al. | 524/106 |
| 4,697,885 | 10/1987 | Minowa et al. | 156/239 |

*Primary Examiner*—John E. Kittle
*Assistant Examiner*—Patrick J. Ryan

[57] ABSTRACT

The method is directed to a method of forming a hermetic flux-sintered ceramic multilayer structure with internal copper conductor comprising:

(a) forming at least one green ceramic layer comprised of a thermoplastic organic binder having dispersed therein a finely divided ceramic powder and a low melting flux;

(b) forming on the surface of a first green ceramic layer a pattern of copper-based conductor paste comprised of fine copper powder, a non-cellulosic binder, and a solvent for the non-cellulosic binder which is a non-solvent for the thermoplastic organic binder in the green ceramic layer;

(c) laminating a second green ceramic layer on the surface of the first ceramic layer to sandwich the pattern therebetween;

(d) heating the composite structure in an ambient gas comprising a dry buffered gas mixture whereby maintaining an oxygen partial pressure sufficient to remove the organics but not to oxidize the copper.

22 Claims, No Drawings

METHOD FOR MAKING A CERAMIC MULTILAYER STRUCTURE HAVING INTERNAL COPPER CONDUCTORS

FIELD OF THE INVENTION

The invention is directed to the manufacture of multilayer ceramic devices having internal copper conductors. The multilayer ceramic device can be either a substrate for mounting active electronic components such as integrated circuits, and may contain built-in passive components such as capacitors and resistors, or the device can be a multilayer ceramic capacitor or resistor.

BACKGROUND OF THE INVENTION

Multilayer ceramic structures with internal conducting layers of metal are well known in the prior art. In general such structures are formed from ceramic green sheets prepared from suspensions of ceramic powders dispersed in thermoplastic polymer and solvent. Conductors are deposited on some of the green sheets in a pattern, usually by screen-printing a paste consisting of a metal powder, an organic binder and solvent. The sheets with conductors on them may also have via or feed-through holes punched in them, as may be required for interconnections between layers in the final multilayer structure. The green sheets are stacked with appropriate registration of the various levels and laminated to form a multilayer structure. This structure is then fired to drive off the organic binders and to sinter the ceramic and metal particulates. The multilayer structure may be diced into smaller units before firing.

Base-metal conductors have been used in some multilayer ceramic structures. In such cases the structures are fired in an atmosphere with low oxygen content to protect the conductors from being oxidized during the firing process. For example, Ni electrodes have been used in multilayer ceramic capacitors containing titanate or zirconate dielectrics, and Mo-Mn alloy has been used for multilayer substrates based on aluminum oxide. These base metals do not melt at the high firing temperatures needed to sinter the ceramic (>1350 C.). Attempts have been made to use highly conducting copper electrodes in multilayer structures but, because copper has a low melting point (1083 C.), ceramic compositions must be modified by adding sintering aids such as low-melting glasses or fluxes to achieve a dense hermetic structure when fired below the melting point of copper.

A major difficulty with using copper electrodes in multilayer ceramic structures is the removal of organic binders before the ceramic sinters. This can lead to discoloration due to carbon entrapment, incomplete densification of the ceramic, or nonuniform or delaminated electrodes. A method to avoid the problem is claimed in U.S. Pat. No. 4,551,357 in which an organic binder is used in the electrode paste which decomposes at a temperature higher than the thermoplastic polymer in the green ceramic sheet. Firing is carried out in a nitrogen atmosphere with not more than 200 ppm oxygen, or in a gas mixture of nitrogen, hydrogen and water vapor. Alternatively, a method for processing multilayer ceramic substrates with copper electrodes is claimed in U.S. Pat. No. 4,234,367 in which organic residues are removed by using long (>12 hours) presintering heat treatments in an atmosphere of nitrogen followed by a mixture of water vapor and hydrogen. In addition, U.S. Pat. No. 4,308,570 and U.S. Pat. No. 4,101,952 disclose multilayer structures in which a pair of copper electrode layers are separated by a dielectric of thickness of about 80 microns in a multilayer ceramic capacitor. Ethyl cellulose was used in the electrode paste and the multilayer structures were sintered in a mixture of carbon dioxide and carbon monoxide.

It has been found that whereas this latter process works well for multilayer structures with few layers of copper conductor, the difficulty of removal of the organic binder from the electrodes in high layer count parts (e.g., five or more) results in inadequate control over the sintering of the copper to achieve continuous layers of uniform thickness.

PRIOR ART

U.S. Pat. No. 4,101,952, Burn

This patent is directed to low-firing monolithic ceramic capacitors having a K value of >1000 in which the dielectric layers consist of 5-15% noncrystalline glass (alkaline earth alumino borate glass) and 98-85% of a crystalline phase (alkaline earth metal titanate) and the electrodes are made of base metal.

U.S. Pat. No. 4,234,367, Herron et al.

The Herron patent is directed to a method of forming glass-ceramic composite structures with copper metallurgy (1) by printing a copper conductor pattern on a green sheet of a crystallizable glass, (2) laminating a second crystallizable glass green sheet on the printed copper pattern and (3) firing the composite structure first in $H_2/H_2O$ to burn out the binder for as long as 12 hours and then in an inert atmosphere to sinter the glass.

U.S. Pat. No. 4,308,570, Burn

This second Burn patent is directed to monolithic ceramic capacitors with copper internal electrodes having a K value of about 10 consisting of 10-50% wt. nonreducible glass (alkaline earth borate) and 90-50% wt. nonreducible crystalline ceramic phase ($MgTiO_3$).

U.S. Pat. No. 4,551,357, Takeuchi

This patent is directed to a process for making ceramic circuit boards by which a Cu/polymer paste is printed on a dielectric green sheet. The organic binder of the Cu paste is thermally more stable than the organic binder of the dielectric. The printed green sheet is heated in an oxidizing atmosphere below the decomposition point of the organic binder and then fired in a low oxygen-containing atmosphere to decompose the organic material.

U.S. Pat. No. 4,607,314, Wada et al.

A low temperature-sinterable ceramic dielectric composition comprising (a) 100 parts of $BaTiO_3$ doped with 0.02 to 0.05 mole Mg, Zr or Ca and (b) 0.2-10 parts of $B_2O_3$ and a metal oxide selected from BaO, MgO, ZnO, BaO and CaO.

U.S. Pat. No. 4,607,315, Wada et al.

A low temperature-sinterable ceramic dielectric composition comprising (a) 100 parts of $BaTiO_3$ doped with 0.02-0.05 mole Mg, Zn, Sr or Ca and (b) 0.2-10 parts $B_2O_3$ or $SiO_2$.

U.S. Pat. No. 4,607,316, Wada et al.

A low temperature-sinterable ceramic dielectric composition comprising (a) 100 parts of $BaTiO_3$ doped with 0.02–0.05 mole Mg, Zn, Sr or Ca and (b) 0.2–10 parts of a mixture of $Li_2O$ and $SiO_2$.

EPO No. 0164841

This reference is directed to ceramic dielectric compositions on electrically insulating glass, organic binder and an inorganic peroxide to facilitate burnout of the binder.

JP-199133-4, Kyocera Corp. (Assignee), Abstract

The reference discloses a glazing paste for use on metallized substrates comprising a barium borosilicate glass dispersed in an organic medium which is a solution of isobutyl methacrylate and α-terpineol.

U.S. Pat. No. 4,612,600, Hodgkins

The reference discloses multilayer capacitors having base metal electrodes which are printed on ceramic green sheets comprising a dielectric material $MTiO_3$ and a LiF flux. The assemblage is sintered at 950 C.

SUMMARY OF THE INVENTION

In a primary aspect, the invention is directed to a method of forming a hermetic flux-sintered ceramic multilayer structure with internal copper conductor comprising:
(a) forming at least one green ceramic layer comprised of a thermoplastic organic binder having dispersed therein a finely divided ceramic powder and a low melting flux;
(b) forming on the surface of a first green ceramic layer a pattern of copper-based conductor paste comprised of fine copper powder, a non-cellulosic binder, and a solvent for the non-cellulosic binder which is a non-solvent for the thermoplastic organic binder in the green ceramic layer;
(c) laminating a second green ceramic layer on the surface of the first ceramic layer to sandwich the pattern therebetween;
(d) heating the composite structure in an ambient gas comprising a dry buffered gas mixture whereby maintaining an oxygen partial pressure sufficient to remove the organics but not to oxidize the copper.

In a secondary aspect, the invention is directed to a thick film conductor composition for use in the above-described method comprising finely divided particles of metallic copper dispersed in a solution of a non-cellulosic binder and an organic solvent which is a nonsolvent for the organic binder of the adjacent green sheets with which it is is used.

DETAILED DESCRIPTION OF THE INVENTION

It has been discovered that when ethyl cellulose in the electrode paste is replaced by an appropriate acrylic binder, good electrode continuity and uniformity can be achieved even in multilayer structures with as many as 25 layers of copper each separated by as little as 25 microns of ceramic. Since ethyl cellulose tends to decompose at a higher temperature than the acrylic binder this result is surprising in view of the teachings of U.S. Pat. No. 4,551,357.

Further, it has been found that the need to use long presintering treatments and/or firing atmospheres with high levels of water vapor can be avoided. Such atmospheres are generally deleterious to the electrical performance of ceramic dielectrics because hydroxyl ions tend to be incorporated into their structure during firing.

The process of the invention for making multilayer ceramic devices with internal copper conductors comprises the use of a novel copper electrode paste together with a dry firing process which results in efficient removal of organic binders during sintering and produces thin, continuous and uniform electrodes of high conductivity in the multilayer device.

A. Green Ceramic Layer

The thin layers of ceramic dielectric used for the fabrication of multilayer devices are comprised of discrete layers of finely divided dielectric particles which are bound together by an organic polymeric material. The unfired ceramic can be prepared by slip casting a slurry of the dielectric particles dispersed in a solution of polymer, plasticizer and solvent onto a carrier such as polypropylene, Mylar ® polyester film or stainless steel and then adjusting the thickness of the cast film by passing the cast slurry under a doctor blade to form a thin "green tape".

Metallizations useful in producing conductors for multilayer structures normally comprise finely divided metal particles applied to green tape in the form of a dispersion of such particles in an inert liquid vehicle. Although the above-described "green tape" process is more widely used, there are nevertheless other procedures with which dielectric compositions of the invention can be used to make such structures. One technique is the so-called "wet process". In one aspect, this may involve passing a flat substrate through a falling sheet of dielectric slip one or more times to build up a dielectric layer (See Hurley et al., U.S. Pat. No. 3,717,487).

Another "wet process" method of making multilayer structures involves forming a paste of the dielectric material and then alternately screen printing the dielectric and metal layers with intervening drying steps until the designed structure is complete. A second electrode layer is then printed atop the dielectric layer(s) and the entire assemblage is cofired.

For the purposes of the invention, it is preferred that the green ceramic contain both a primary dielectric material, e.g., $BaTiO_3$, and a nonreducing glass frit (flux) which contains essentially no Pb, Bi or Cd. It is essential that the flux have sufficiently low melting point in order that it undergoes liquid phase sintering at the firing temperature. Preferred fluxes consist of (a) glass-forming oxides selected from $B_2O_3$, $SiO_2$, $GeO_2$, $P_2O_5$ and precursors and mixtures thereof and (b) glass modifying oxides selected from $Li_2O$, ZnO, $Al_2O_3$, BaO, CaO, MgO, SrO and precursors and mixtures thereof.

Dielectric compositions based on barium titanate are substantially free from easily reducible oxides such as PbO, $Bi_2O_3$ and CdO. Donor dopants selected from niobium oxide and rare-earth oxides such as neodymium oxide are used as Curie point shifters, together with zirconium oxide. High dielectric constant and high resistivity following sintering under reducing conditions are achieved by (a) partial compensation of the donors with an acceptor dopant, preferably manganese oxide, and (b) precise balance of cation stoichiometry. The flux consists of a small amount of a glass-forming oxide, preferably boron oxide, together with ZnO and/or $Li_2O$, and may include BaO and $MnO_2$.

Preferred ceramic materials with the green tapes to be used in the invention are those disclosed in applicant's copending U.S. patent application Ser. No.

003,260 filed simultaneously herewith, which is incorporated by reference.

B. Conductive Paste

Because of their good printing characteristics, electrode pastes used for multilayer structures that are fired in air usually contain an ethyl cellulose binder. However, some preliminary experiments indicated that uniform sintered internal copper electrodes could not be obtained with this type of electrode paste. This was particularly the case for a large number of layers, because of the difficulty of burning out the binder from the electrodes in the center of the multilayer without excessive oxidation of the outer electrodes.

Accordingly, a copper electrode paste has been developed based on a non-cellulosic binder, which avoids the burnout problem associated with ethyl cellulose binders and which has excellent printing characteristics at low metal laydowns (about 2 micrometers fired).

A major difficulty of using non-cellulosic binders, such as acrylates, for screen printable electrode pastes is that the solvent reacts with the green tape. Also the paste sticks to the screen, and/or flows excessively unless low binder levels are used. At low binder levels, the solids content of the paste is high and the print deposit is usually too thick, leading to problems with nonuniform shrinkage of the multilayer ceramic structure. These problems have been solved by formulating the paste with a poor solvent for acrylics, $\beta$-terminal. The methyl methacrylates such as Elvacite®2041, 2010, and 2008 manufactured by E. I. du Pont de Nemours and Company cannot be dissolved in $\beta$-terpineol even at concentrations as low as 10% by weight. However, it was found that the butyl methacrylate Elvacite®2044 was readily soluble in the 20-30 wt. % concentration range. The conductive paste is formulated by dissolving the n-butyl methacrylate polymer in terpineol (20/80 by wt.) and then blending a fine copper powder of about 1 micron particle size, preferably with a suitable surfactant to improve dispersion stability. The blend is then roll milled or mulled to complete the dispersion. When made at a metal loading of 55% by weight and used with a 400-mesh screen, excellent electrode uniformity at very thin layers (62.5 microns) was achieved in fired multilayer ceramic capacitors with many electrodes.

C. Firing Process

The multilayer ceramic devices with internal copper electrodes are fired in a commercial furnace (Cladan, Inc.) which has been specially sealed to contain a controlled atmosphere without significant leakage. Use of atmospheres with controlled oxygen partial pressures for firing multilayer ceramic structures with base metal electrodes is well known. Atmospheres of $N_2$, $H_2+N_2$, $CO+CO_2+N_2$ have been described, and a variety of other atmospheres including $H_2+H_2O+N_2$, and $CO_2+H_2+N_2$ can be used. We have chosen to use $CO_2+H_2+N_2$ because of the atmosphere control provided by such a mixture, and for safety reasons: nonexplosive levels of $H_2$ are needed, and the storage and piping of carbon monoxide are not required.

The green multilayer devices can be prefired at 400 C. in $N_2$ to remove most of the organic binders or they can be sintered directly without prefiring. A convenient heating rate is 25 C./min to 750 C. decreasing to 10 C./min to 1050 C. The soak period is usually 2-2.5 hours at 1050-1065 C., and then the furnace is cooled at its natural rate. A gas mixture of nitrogen, carbon dioxide, and hydrogen circulates through the furnace during the entire cycle (heating and cooling) at a flow rate adequate to maintain a slight positive pressure. The ratio of carbon dioxide to hydrogen determines the oxygen partial pressure. The ratio should be kept between about 10/1 and 50/1. If the atmosphere is too reducing (too low ratio of $CO_2/H_2$), then delamination of the multilayer device is more likely to occur due to premature sintering of the electrodes and/or, in the case of titanate dielectrics, the ceramic can become semiconducting. If the ratio is too high, the copper electrodes will partially oxidize and can react excessively with, or dissolve into the ceramic. A slight reaction between the electrodes and ceramic can be beneficial to good bonding but should be minimized to avoid variations in properties for differing ceramic thicknesses and numbers of electrodes.

EXAMPLES

EXAMPLE 1

A copper electrode paste suitable for the internal electrodes in a cofired multilayer ceramic structure was prepared as follows. Elvacite 2044, a butyl methacrylate resin manufactured by Du Pont, was dissolved in beta terpineol to give a 20% solution by weight. Fifty-five parts by weight of copper powder with a particle size of about 1 micrometer, such as Powder #10 manufactured by Metz Metallurgical Corp. (South Plainfield, N.J.), was blended with 44.5 parts by weight of the acrylic medium together with 0.5 parts by weight of RK-500 surfactant (GAF Corporation, New York, N.Y.). Intimate mixing was achieved by mulling or roll-milling.

A barium titanate ceramic green tape was made from a slurry prepared by mixing the following powders (in parts by weight), with Du Pont 5200 acrylic binder mix: 85.0 barium titanate, 10.0 barium zirconate, 2.0 neodymium oxide, 0.5 lithium carbonate and 2.83 manganese-doped barium-zinc borate frit. Sixty-six parts by weight binder mix was used with 100 parts powder. The binder mix consisted of 8.5 parts acrylic polymer in 19.8 parts MEK, 2.0 parts butyl benzyl pthalate plasticizer, 1.5 parts of a 10% solution of Poly-Pale ® resin (Hercules, Inc.) in isopropanol, and 68.2 parts 1-1-1-trichlorethane solvent. The ceramic green tape was cast at a thickness of about 35 micrometers (dry).

Multilayer ceramic capacitors were assembled with 25 layers of green tape with electrodes screen-printed on each layer, and cover plates of eight layers of green tape on the top and bottom. The electrodes were printed using the copper paste described above and a 400 mesh screen. The multilayer structures were laminated at 8000 psi.

Although most of the organic binder could have been removed from the multilayers by preheating in nitrogen at 400 C. for about 1 hour, the MLC's were fired without prior binder removal by heating in an atmosphere of nitrogen, hydrogen and carbon dioxide. The hydrogen was a 4% mixture in nitrogen and a carbon dioxide/hydrogen ratio of 50/1 was used. The total nitrogen level was about 3 times the amount of carbon dioxide. The furnace was heated to 750 C. in 30 minutes and then to 1050 C. in a further 30 minutes. A maximum temperature of 1050-1065 C. was maintained for 150 minutes during which the oxygen level in the furnace was approximately $10^{-9}$ atmospheres as indicated by an in situ zirconia oxygen sensor. The furnace was then cooled at its natural rate. The hydrogen/carbon dioxide mixture was switched off when the temperature had dropped below about 500 C.

The multilayer capacitors were terminated using Du Pont 7001D copper termination paste which was fired on at 700 C. in nitrogen. Electrical measurements were made with a Hewlett Packard 4192A impedance analyzer and a Hewlett Packard 4192B picoammeter. Capacitance was 0.42 microfarad, dissipation factor was less than 2.0% at 1 kHz, and insulation resistance was 20,000 ohm.farads. Microscopy of polished sections of the capacitors showed them to be dense (no connected porosity) and to have excellent electrode uniformity, i.e., the electrodes were smooth and continuous with no evidence of delamination. The dielectric constant of the ceramic was calculated to be 8200–8600.

EXAMPLE 2

Ceramic green tape was made as in Example 1 but the composition was $85.6BaTiO_3$, $10.0CaZrO_3$, $0.63Nd_2O_3$, $0.50Nb_2O_5$, $0.5Li_2CO_3$, and 3.0 barium borate frit. The tape was laminated into plates approximately $1 \times 1 \times 0.03$ cm in size. These were fired as described above but without electrodes. After firing, the ceramic was blue and conducting with a resistance of 230 ohms. It is anticipated that this or a similar composition could be used as a resistor material by making a multilayer structure wih copper electrodes and adjusting the resistance by varying the number and/or thickness of the ceramic layers.

EXAMPLE 3

A ceramic green tape was made as in Example I but the ceramic composition was 77.8 parts by weight silica glass powder (Imsil A-108, Illinois Minerals Co.) and 22.2 parts zinc borate frit of composition $2ZnO \cdot B_2O_3$. Also, the binder mix used was 66 parts binder mix to 50 parts powder.

Multilayer structures were made and fired as in Example 1, except that the multilayers had six internal copper electrodes. Capacitance was 43.1 to 48.7 picofarads and dissipation factor was 0.11% at 1 kHz. Insulation resistance was 2500–10600 ohm.farads, i.e., $>10^{13}$ ohms, with 100 V applied. The ceramic had no connected porosity and the electrodes had good uniformity with no sign of delamination. The dielectric constant was calculated to be $4.2 +/- 0.2$.

EXAMPLE 4

It is anticipated that the procedures described in the above examples could be used to construct a cofired interconnected multilayer structure for mounting semiconductor or integrated circuit chips. Because of its low K, high insulation resistance and compatibility with copper conductors, the procedure of Example 3 could be used to make a ceramic substrate. The identical processing requirements of the materials described in Examples 1 and 2, suggest that capacitors and resistors could be integrated within the substrate and interconnected by conventional via techniques using the unique conductor compositions and firing procedure described above.

EXAMPLE 5

The advantageous properties of the electrode paste described in Example 1 can be compared with performance of electrode pastes made with other acrylic polymers (Du Pont Elvacites) and solvents, as summarized in Table 1. It can be seen that the use of a butyl methacrylate, the only polymer in Table 1 which is soluble in beta-terpineol, gave superior performance.

TABLE 1

| ELECTRODE PASTE COMPOSITIONS (wt. %) | | | | | | |
|---|---|---|---|---|---|---|
| Acrylic* | Mol. Wt. | Solvent | Polymer Conc. % | Amount (Wt. %) | Copper Powder | Comments |
| 2010 | medium low | Carbitol acetate+ | 30.0 | 7.2 | 87.0 | Excessive |
| 2008 | | Carbitol acetate | 30.0 | 3.1 | | laydown |
| — | | Carbitol acetate | — | 2.7 | | |
| 2010 | medium low | Carbitol acetate | 30.0 | 20.0 | 55.0 | Too thin-runny |
| 2008 | | Carbitol acetate | 30.0 | 15.0 | | |
| — | | Carbitol acetate | — | 10.0 | | |
| 2041 | very high | Carbitol acetate | 17.5 | 25.0 | 55.0 | Too elastic gummy |
| 2008 | low | Carbitol Acetate | 30.0 | 10.0 | | |
| — | | Carbitol acetate | — | 9.0 | | |
| — | | RK-500 (Surfactant) | — | 1.0 | | |
| 2010 | medium very | Carbitol acetate | 30.0 | 10.0 | 55.0 | Fair rheology too sticky bubbles |
| 2041 | high low | Carbitol acetate | 17.5 | 12.5 | | |
| 2008 | | Carbitol acetate | 30.0 | 12.5 | | |
| — | | Carbitol acetate | — | 9.5 | | |
| — | | RK-500 (Surfactant) | — | 0.5 | | |
| 2010 | medium very | Carbitol acetate | 30.0 | 25.0 | 50.0 | Fair rheology bubbles ink soaked |
| 2041 | high | Carbitol | 17.5 | 12.5 | | |

TABLE 1-continued

ELECTRODE PASTE COMPOSITIONS (wt. %)

| Acrylic* | Mol. Wt. | Solvent | Polymer Conc. % | Amount (Wt. %) | Copper Powder | Comments |
|---|---|---|---|---|---|---|
| | | acetate | | | | into ceramic |
| — | | Carbitol acetate | — | 12.0 | | |
| — | | RK-500 (Surfactant) | — | 0.5 | | |
| 2044** | high | β-Terpineol# | 20.0 | 44.5 | 55.0 | Good printing |
| — | | RK-500 (Surfactant) | — | 0.5 | | Good uniformity |

*Elvacite ® methyl methacrylate polymer resins made by E. I. du Pont de Nemours and Company, Wilmington, DE
**Elvacite ® n-Butyl methacrylate polymer resin
+Supplied by Ashland Chem. Co.
Made by Hercules. Inc.

I claim:

1. A thick film copper paste composition comprising an admixture of finely divided particles of metallic copper dispersed in a liquid organic medium comprising n-butyl methacrylate dissolved in an organic solvent in which other non-cellulosic polymers are insoluble.

2. The composition of claim 1 in which the organic solvent is terpineol.

3. A multilayer electronic element comprising a plurality of patterned conductive layers of thick film copper paste comprising an admixture of finely divided particles, metallic copper dispersed in a liquid organic medium comprising n-butyl methacrylate dissolved in an organic solvent in which other acrylic polymers are insoluble, each of which layers is sandwiched between green ceramic layers comprising finely divided particles of ceramic dielectric material and nonreducing low melting glass dispersed in a solid matrix of thermoplastic acrylic polymer binder which has been fired in a buffered low oxygen containing atmosphere to effect the volatilizable of the organic medium of the thick film copper paste and the polymer matrix of the green ceramic layers.

4. A method of making an hermetic flux-sintered ceramic multilayer element having internal copper conductors using green ceramic layers comprising finely divided particles of ceramic dielectric material and nonreducing low melting glass dispersed in a solid matrix of thermoplastic acrylic polymer binder and a thick film copper conductive paste comprising finely divided particles of copper metal dispersed in a liquid organic medium comprising a non-cellulosic polymer binder dissolved in an organic solvent which is a nonsolvent for the thermoplastic polymer binder in the green ceramic layers, comprising the sequential steps of
 a. applying a pattern of conductive paste to an unpatterned surface of a first green ceramic layer;
 b. applying an unpatterned green ceramic layer to the patterned side of the first green ceramic layer;
 c. applying a pattern of conductive paste to an unpatterned surface of a further green ceramic layer;
 d. applying the patterned side of the further green ceramic layer of step c. to an outer surface of the composite structure of step b. to form a multilayer structure comprising a plurality of conductive pattern layers sandwiched between layers of green ceramic;
 e. optionally repeating the sequence of steps c. and d., and
 f. heating the composite structure of steps d. and e. in a buffered low oxygen-containing atmosphere for a time and at a temperature sufficient completely to remove the organics without oxidizing the copper in the conductive paste.

5. A method of making an hermetic flux-sintered ceramic multilayer element having internal copper conductors using green ceramic layers, comprising finely divided particles of ceramic dielectric material and nonreducing low-melting glass dispersed in a solid matrix of thermoplastic acrylic polymer binder and a thick film copper conductive paste comprising finely divided particles of copper metal dispersed in a liquid organic medium comprising a non-cellulosic binder dissolved in an organic solvent which is a nonsolvent for the thermoplastic polymer binder in the green ceramic layers, comprising the sequential steps of
 a. applying a pattern of conductive paste to an unpatterned surface of a first green ceramic layer;
 b. applying an unpatterned green ceramic layer to the patterned side of the first green ceramic layer;
 c. applying a pattern of conductive paste to an unpatterned outer surface of the composite structure of step b.;
 d. applying an unpatterned green ceramic layer to a patterned outer surface of the composite structure of step c. to form a multilayer structure comprising a plurality of conductive pattern layers sandwiched between layers of green ceramic, and
 e. repeating the sequence of steps c. and d. and
 f. heating the composite structure of steps c. and d. in a buffered low oxygen-containing atmosphere for a time and at a temperature and oxygen partial pressure sufficient completely to remove the organics without oxidizing the copper in the conductive paste.

6. A method for making an hermetic flux-sintered ceramic multilayer element having internal copper electrodes comprising the sequential steps of:
 a. to an unpatterned surface of a first greeen ceramic layer comprised of finely divided particles of ceramic dielectric material dispersed in a solid matrix of thermoplastic acrylic polymer binder, applying a pattern of thick film conductive paste comprising finely divided particles of copper metal dispersed in a liquid organic medium comprising a non-cellulosic polymer binder dissolved in an organic solvent which is a nonsolvent for the thermoplastic polymer binder of the green ceramic tape;
 b. applying an unpatterned green ceramic layer to the patterned side of the first green ceramic layer;

c. applying a pattern of conductive paste to an unpatterned surface of a further green ceramic layer;

d. applying the patterned side of the further green ceramic layer of step c. to an outer surface of the composite structure of step b. to form a multilayer structure comprising a plurality of conductive pattern layers sandwiched between layers of green ceramic;

e. optionally repeating the sequence of steps c. and d., and f. heating the composite structure of steps d. and e. in a buffered low oxygen-containing atmosphere for a time and at a temperature sufficient completely to remove the organics without oxidizing the copper in the conductive paste.

7. A method for making an hermetic flux-sintered ceramic multilayer element having internal copper electrodes comprising the sequential steps of:

a. to an unpatterned surface of a first green ceramic layer comprised of finely divided particles of ceramic dielectric material dispersed in a solid matrix of thermoplastic acrylic polymer binder, applying a pattern of thick film conductive paste comprising finely divided particles of copper metal dispersed in a liquid organic medium comprising a non-cellulosic polymer binder dissolved in an organic solvent which is a nonsolvent for the thermoplastic polymer binder of the green ceramic tape;

b. applying an unpatterned green ceramic layer to the patterned side of the first green ceramic layer;

c. applying a pattern of conductive paste to an unpatterned outer surface of the composite structure of step b.;

d. applying an unpatterned green ceramic layer to a patterned outer surface of the composite structure of step c. to form a multilayer structure comprising a plurality of conductive pattern layers sandwiched between layers of green ceramic;

e. repeating the sequence of steps c. and d.; and f. heating the composite structure of steps c. and d. in a buffered low oxygen-containing atmosphere for a time and at a temperature and oxygen partial pressure sufficient completely to remove the organics without oxidizing the copper in the conductive paste.

8. The method of either claim 6 or 7 in which the green ceramic layers are ceramic green tapes.

9. The method of either claim 6 or 7 in which the green ceramic layers are deposited by wet processing.

10. The method of either claim 6 or 7 in which the non-cellulosic polymer binder is an acrylic polymer.

11. The method of either claim 6 or 7 in step a. of which the conductive paste is applied to a substrate comprising a plurality of laminated layers of green ceramic layers.

12. The method of either claim 6 or 7 in which at least one layer of unpatterned green ceramic is interposed by application upon the unpatterned outer surface of the composite structure of step b. prior to applying the conductive paste pattern thereon.

13. The method of claim 6 or 7 wherein the multilayer structure is a substrate for mounting electronic components.

14. The method of claim 6 or 7 wherein the multilayer structure is a ceramic capacitor.

15. The method of claim 6 or 7 wherein the multilayer structure is a substrate having internal capacitor and resistor layers.

16. The method of claim 6 or 7 wherein said finely divided ceramic dielectric material is selected from $Al_2O_3$, $SiO_2$, MgO, ZnO and mixtures and compounds thereof, and alkaline metal titanates such as $BaTiO_3$, $SrTiO_3$, $CaTiO_3$ and $MgTiO_3$ and mixtures and compounds thereof.

17. The method of claim 6 or 7 wherein the low melting flux consists essentially of a glass forming oxide selected from $B_2O_3$, $SiO_2$, $GeO_2$, $P_2O_5$ and precursors and mixtures thereof, and modifying oxides selected from $Li_2O$, ZnO, $Al_2O_3$, BaO, CaO, MgO, SrO and precursors and mixtures thereof.

18. The method of claim 6 or 7 wherein the thermoplastic organic binder in the green ceramic layers is selected from a methyl methacrylate, ethyl methacrylate, methyl acrylate and mixtures thereof.

19. The method of claim 5 wherein the acrylic binder in the copper paste is butyl methacrylate.

20. The method of claim 6 or 7 wherein the solvent for the binder in the copper paste is terpineol.

21. The method of claim 6 wherein the dry buffered gas mixture is $N_2 + CO_2 + H_2$, the ratio of $N_2$ to $CO_2 + H_2$ being not more than 10, and the ratio of $CO_2$ to $H_2$ being in the range of 10 to 150.

22. The method of claim 6 wherein the temperature is 850–1080 C. and the heating and soak time is not more than 5 hours.

* * * * *